US011343947B2

(12) United States Patent
Pal (10) Patent No.: US 11,343,947 B2
(45) Date of Patent: May 24, 2022

(54) POWER CONVERTER COOLING (71) Applicant: Rohr, Inc, Chula Vista, CA (US)

(72) Inventor: Debabrata Pal, Hoffman Estates, IL (US)

(73) Assignee: Rohr, Inc., Chula Vista, CA (US)

( * ) Notice: Subject to any disclaimer, the term of this patent is extended or adjusted under 35 U.S.C. 154(b) by 188 days.

(21) Appl. No.: 16/143,303

(22) Filed: Sep. 26, 2018

(65) Prior Publication Data

US 2020/0100399 A1 Mar. 26, 2020

(51) Int. Cl.
*H05K 7/20* (2006.01)
*B64D 41/00* (2006.01)

(52) U.S. Cl.
CPC ......... *H05K 7/20909* (2013.01); *B64D 41/00* (2013.01)

(58) Field of Classification Search
USPC ........ 60/203.1, 226.1, 262, 264, 266, 39.83, 60/785
See application file for complete search history.

(56) References Cited

U.S. PATENT DOCUMENTS

| 4,773,212 A * | 9/1988 | Griffin | .................... F02C 7/224 60/226.1 |
| 5,357,742 A | 10/1994 | Miller | |
| 6,236,184 B1 * | 5/2001 | Baker | ................... H02M 7/003 318/803 |
| 6,651,929 B2 * | 11/2003 | Dionne | .................. B64D 41/00 244/57 |
| 7,866,609 B2 | 1/2011 | Parikh | |
| 8,844,264 B2 | 9/2014 | Khalid | |
| 10,892,665 B2 * | 1/2021 | Pal | ........................... H02P 9/02 |
| 2007/0000231 A1 | 1/2007 | Otsuka et al. | |
| 2013/0113222 A1 * | 5/2013 | Wilkinson | ............. H02K 29/12 290/1 R |
| 2017/0175748 A1 * | 6/2017 | Pal | ....................... F04D 29/584 |
| 2018/0111676 A1 | 4/2018 | Pal | |

FOREIGN PATENT DOCUMENTS

| CN | 106949652 | 7/2017 |
| EP | 3290659 | 3/2018 |
| EP | 3537578 | 9/2019 |

OTHER PUBLICATIONS

European Patent Office, European Search Report dated Feb. 4, 2020 in Application No. 19199619.8.

* cited by examiner

*Primary Examiner* — Steven B Mcallister
*Assistant Examiner* — Elizabeth M. May
(74) *Attorney, Agent, or Firm* — Snell & Wilmer L.L.P.

(57) ABSTRACT

An active laminar flow control arrangement may comprise a variable speed constant frequency (VSCF) converter comprising a housing, a compressor, an electric motor operably coupled to the compressor, and a laminar flow control duct. An airflow is received by the housing from the laminar flow control duct in response to the electric motor driving the compressor for cooling the VSCF converter.

20 Claims, 5 Drawing Sheets

POWER CONVERTER COOLING

FIELD

The present disclosure relates to gas turbine engines, and specifically to engine mounted power converter cooling systems and methods.

BACKGROUND

Variable speed constant frequency (VSCF) power converters are used to provide constant frequency power. VSCF converters may generate heat during operation.

SUMMARY

An active laminar flow control arrangement is disclosed, comprising a variable speed constant frequency (VSCF) converter comprising a housing, a compressor coupled to the housing, an electric motor operably coupled to the compressor, and a laminar flow control duct coupled to the housing, wherein an airflow is received by the housing from the laminar flow control duct in response to the electric motor driving the compressor.

In various embodiments, the compressor compresses the airflow.

In various embodiments, the airflow is received by the compressor from the housing in response to the electric motor driving the compressor.

In various embodiments, the airflow is received by the electric motor from the compressor in response to the electric motor driving the compressor.

In various embodiments, the VSCF converter comprises a first plate, a second plate, and a fin core extending between the first plate and the second plate.

In various embodiments, the airflow flows across the fin core and provides cooling to the VSCF converter.

In various embodiments, the VSCF converter is configured to convert a three-phase variable frequency power to a three-phase constant frequency power.

In various embodiments, the three-phase variable frequency power is received from a generator that is driven by a gas turbine engine.

In various embodiments, the active laminar flow control arrangement further comprises a duct coupled between the housing and the compressor whereby the airflow is directed from the VSCF converter and the compressor.

A cooling arrangement is disclosed, comprising a variable speed constant frequency (VSCF) converter comprising a plurality of electronic components disposed in a housing, a compressor coupled to the housing, and an electric motor operably coupled to the compressor, wherein an airflow is drawn into the compressor from the housing in response to the electric motor driving the compressor.

In various embodiments, the compressor is in fluid communication with the housing.

In various embodiments, the electric motor is in fluid communication with the housing.

In various embodiments, the airflow is received by the electric motor from the compressor in response to the electric motor driving the compressor.

In various embodiments, the airflow provides cooling to the VSCF converter in response to the airflow flowing through the housing.

In various embodiments, the cooling arrangement further comprises a first duct coupled between the housing and the compressor.

In various embodiments, the cooling arrangement further comprises a second duct coupled between the compressor and the electric motor whereby the airflow is received by the electric motor from the compressor.

In various embodiments, the cooling arrangement further comprises a third duct coupled between the compressor and the electric motor whereby the airflow is recirculated from the electric motor to the compressor.

A method for cooling a variable speed constant frequency (VSCF) converter is disclosed, comprising driving, by an electric motor, a compressor, compressing, by the compressor, an airflow in response to the compressor being driven by the electric motor, receiving, by the VSCF converter, the airflow in response to the compressor being driven by the electric motor, and cooling, by the airflow, the VSCF converter in response to the airflow being received by the VSCF converter.

In various embodiments, the method further comprises receiving, by the VSCF converter, the airflow prior to the airflow being compressed by the compressor.

In various embodiments, the method further comprises receiving, by the electric motor, the airflow subsequent to the airflow being compressed by the compressor.

The foregoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

As used herein, "aft" refers to the direction associated with the tail (e.g., the back end) of an aircraft, or generally, to the direction of exhaust of the gas turbine engine. As used herein, "forward" refers to the direction associated with the nose (e.g., the front end) of an aircraft, or generally, to the direction of flight or motion.

For an aircraft application, it may be desirable to locate the VSCF converter near a generator which is located at an engine gearbox. It may be desirable to actively cool the VSCF converter to increase the reliability and lifespan thereof during operation. Available sources of cooling the VSCF converter near the engine gearbox may include oil or bypass air flow. However, gearbox oil may be relatively hot (>212° F. (>100° C.)) and use of bypass air flow may result in reduction in propulsion performance of the engine.

An active laminar flow control (ALFC) arrangement is disclosed herein. The ALFC arrangement is in thermal communication with the VSCF converter. Stated differently, the ALFC arrangement is in fluid communication with the VSCF converter, whereby the ALFC arrangement directs an airflow through the VSCF converter for active cooling thereof. In this regard, the airflow is sourced from the active laminar flow control ducts. Air drawn into the ALFC arrangement from the atmosphere may provide exceptional cooling—particularly at cruising altitudes where the static air temperatures may be approximately −69° F. (−56° C.)—to the VSCF converter. The total air temperature at cruising altitudes may be approximately −13° F. (−25° C.).

Figure 1:
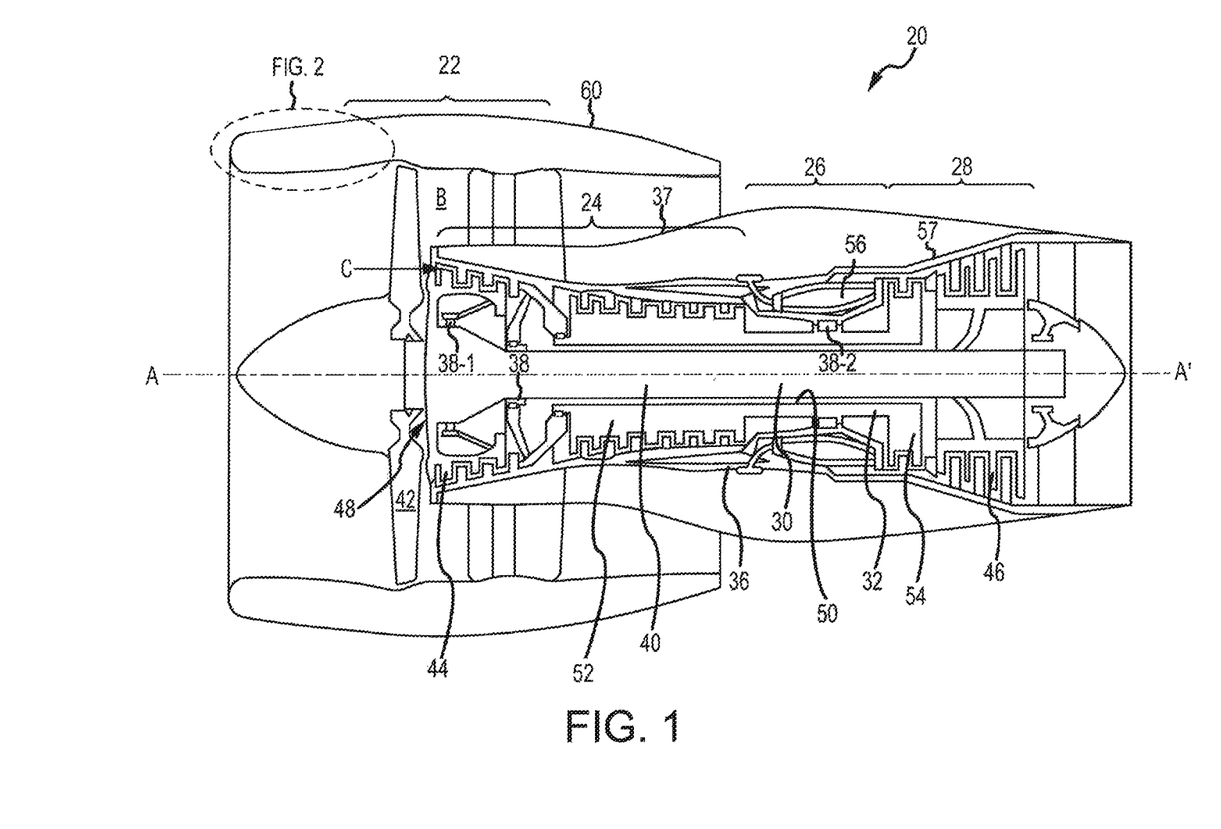
FIG. 1 is a schematic view of an exemplary gas turbine engine, in accordance with various embodiments.

In various embodiments and with reference to FIG. 1, a gas turbine engine 20 is provided. Gas turbine engine 20 may be a two-spool turbofan that generally incorporates a fan section 22, a compressor section 24, a combustor section 26 and a turbine section 28. In operation, fan section 22 can drive air along a bypass flow-path B while compressor section 24 can drive air along a core flow-path C for compression and communication into combustor section 26 then expansion through turbine section 28.

Gas turbine engine 20 may generally comprise a low speed spool 30 and a high speed spool 32 mounted for rotation about an engine central longitudinal axis A-A' relative to an engine static structure 36 via several bearing systems 38, 38-1, and 38-2. It should be understood that various bearing systems 38 at various locations may alternatively or additionally be provided, including for example, bearing system 38, bearing system 38-1, and bearing system 38-2.

Low speed spool 30 may generally comprise an inner shaft 40 that interconnects a fan 42, a low pressure (or first) compressor section 44 and a low pressure (or first) turbine section 46. Gas turbine engine 20 may comprise a geared architecture 48 that can drive fan 42 at a lower speed than low speed spool 30. Geared architecture 48 may comprise a gear assembly enclosed within a gear housing. The gear assembly may couple inner shaft to a rotating fan structure. High speed spool 32 may comprise an outer shaft 50 that interconnects a high pressure (or second) compressor section 52 and high pressure (or second) turbine section 54. A combustor 56 may be located between high pressure compressor 52 and high pressure turbine 54. A mid-turbine frame 57 of engine static structure 36 may be located generally between high pressure turbine 54 and low pressure turbine 46. Mid-turbine frame 57 may support one or more bearing systems 38 in turbine section 28. Inner shaft 40 and outer shaft 50 may be concentric and rotate via bearing systems 38 about the engine central longitudinal axis A-A', which is collinear with their longitudinal axes. As used herein, a "high pressure" compressor or turbine experiences a higher pressure than a corresponding "low pressure" compressor or turbine.

The core airflow C may be compressed by low pressure compressor section 44 then high pressure compressor 52, mixed and burned with fuel in combustor 56, then expanded over high pressure turbine 54 and low pressure turbine 46. Turbines 46, 54 rotationally drive the respective low speed spool 30 and high speed spool 32 in response to the expansion.

In various embodiments, a nacelle 60 may surround gas turbine engine 20. Nacelle 60 may at least partially define bypass flow-path B disposed radially between inner fixed structure (IFS) 37 and nacelle 60.

Figure 2:
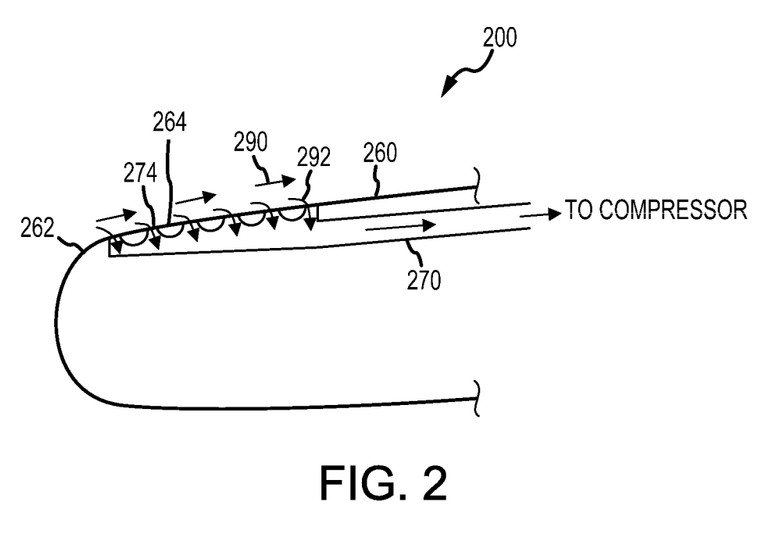
FIG. 2 is a schematic view of an exemplary laminar flow control duct arrangement, in accordance with various embodiments.

With reference to FIG. 2, an ALFC duct arrangement 200 is illustrated for a nacelle 260. In various embodiments, nacelle 260 may be similar to nacelle 60 of FIG. 1. ALFC duct arrangement 200 may include a duct (also referred to herein as an ALFC duct) 270 may be disposed within nacelle 260. Duct 270 may be in fluid communication with a plurality of orifices 274 disposed in the outer aerodynamic surface 264 of nacelle 260. Duct 270 may be in fluid communication with a compressor (see FIG. 3) whereby an airflow 292 is drawn into duct 270 from outside of nacelle 260. In this manner a laminar flow 290 is maintained over nacelle 260, thereby increasing the aerodynamic performance of the nacelle 260. In various embodiments, orifices 274 may be disposed in an inlet section 262 of nacelle 260. However, it is contemplated that the present disclosure may be useful for an active laminar flow control system for any desirable aerodynamic surface of an aircraft.

Figure 3:
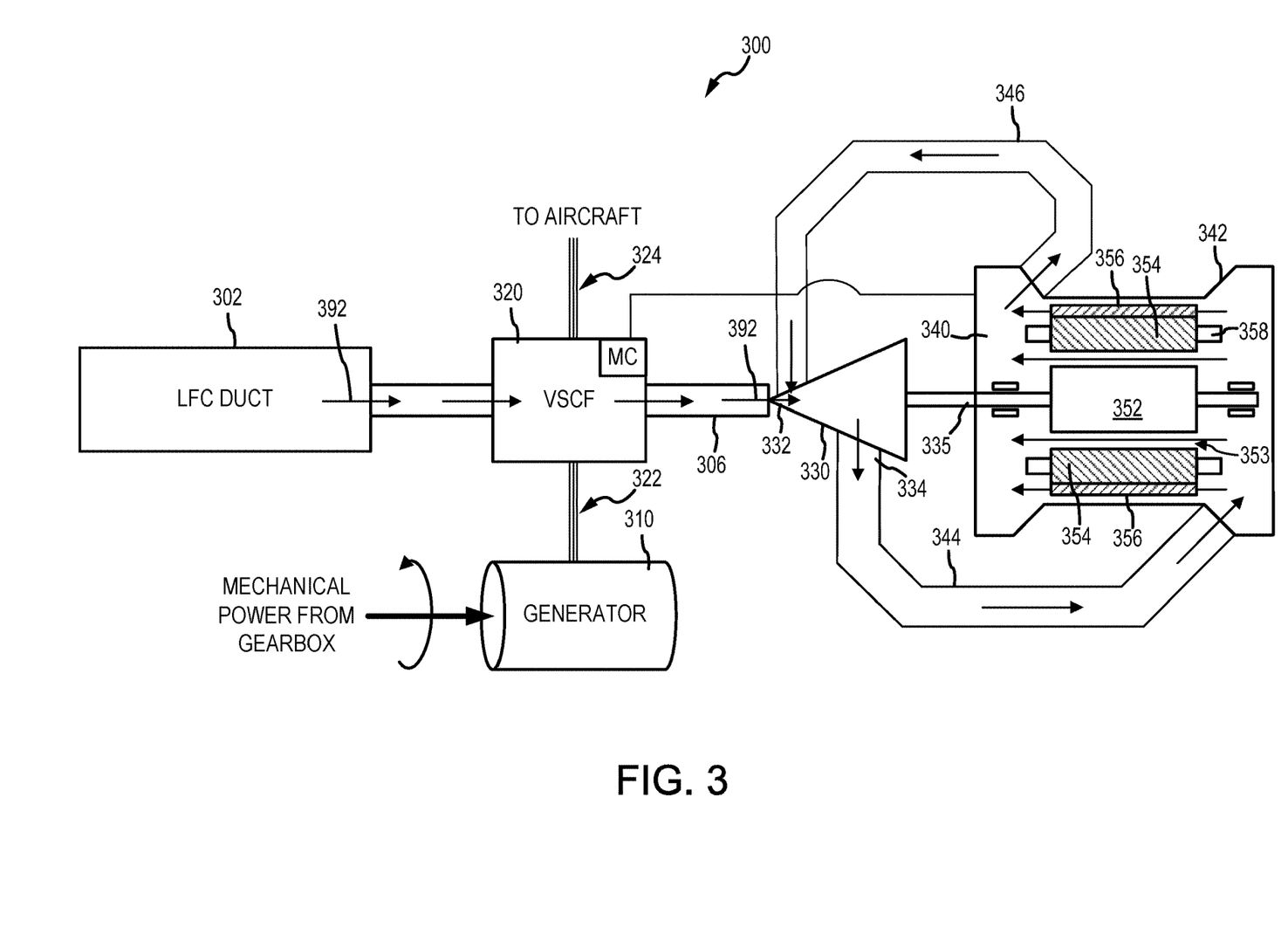
FIG. 3 is a schematic view of an active laminar flow control duct arrangement configured for cooling a variable speed constant frequency (VSCF) converter, in accordance with various embodiments.

With reference to FIG. 3, an active laminar flow control arrangement (also referred to herein as a cooling arrangement or an arrangement) 300 is illustrated, in accordance with various embodiments. Arrangement 300 may include an ALFC duct arrangement 302. ALFC duct arrangement 302 may be similar to ALFC duct arrangement 200 of FIG. 2. Thus, an airflow 392 may be drawn in from an aerodynamic surface, such as an aerodynamic surface of nacelle 260 (see FIG. 2).

In various embodiments, arrangement 300 includes a generator 310. Generator 310 may be driven via gears (e.g., geared architecture 48 of FIG. 1) of a gas turbine engine. Generator 310 may be driven, via the gears, by a turbine section of the gas turbine engine (e.g., low pressure (or first) turbine section 46 or high pressure (or second) turbine section 54). Generator 310 may generate a three-phase variable frequency alternating current (AC) power 322. The frequency of the AC power generated by generator 310 may be proportional to the speed at which a shaft of generator 310 is spinning. In various embodiments, generator 310 may be configured to generate between 50 and 130 kilowatts (kW), and in various embodiments, generator 310 may be configured to generate approximately 90 kW. In various embodiments, generator 310 is a permanent magnet generator. In various embodiments, generator 310 is a synchronous generator. It is appreciated, however, that the generator 310 is not particularly limited to any specific type or configuration.

In various embodiments, arrangement 300 includes a variable speed constant frequency (VSCF) converter 320. VSCF converter 320 may be mounted onboard nacelle 60 (see FIG. 1). Thus, it may be said that VSCF converter 320 is engine mounted, or is an engine mounted VSCF converter 320, in accordance with various embodiments. VSCF converter 320 may be configured to convert the three-phase variable frequency AC power 322 received from generator 310 to a three-phase constant frequency AC power 324. VSCF converter 320 may send the three-phase constant frequency AC power 324 for powering various electronics onboard an aircraft. In various embodiments, the three-phase constant frequency AC power 324 may comprise a 400 Hertz signal. In various embodiments, the three-phase constant frequency AC power 324 may comprise a power signal comprising a frequency of between 200 and 600 Hertz. It is appreciated, however, that the frequency of three-phase constant frequency AC power 324 is not limited thereto. VSCF converter 320 may comprise various electronic components which tend to generate heat during operation. The waste heat generated in VSCF converter 320 may be approximately four to five kilowatts (4-5 kW) for a ninety kilowatt (90 kW) generator, in accordance with various embodiments.

In various embodiments, arrangement 300 includes a compressor 330. Compressor 330 may draw in airflow 392 from ALFC duct arrangement 302. The airflow 392 may be drawn through VSCF converter 320, as will be discussed in further detail herein. Airflow 392 may thereby provide cooling to VSCF converter 320, thereby prolonging the usable lifespan of VSCF converter 320 and increasing the reliability thereof. ALFC duct arrangement 302 may be in fluid communication with VSCF converter 320. Compressor 330 may be in fluid communication with VSCF converter 320 via a duct (also referred to herein as a first duct) 306.

In various embodiments, airflow 392 is received by VSCF converter 320 from ALFC duct arrangement 302 in response to electric motor 340 driving compressor 330. FIG. 3 depicts VSCF converter 320 in electric communication with electric motor 340 via a motor controller (MC), in accordance with various embodiments. In this regard, electric motor 340 may be powered by VSCF converter 320. In this regard, VSCF converter 320 may be in fluid communication with ALFC duct arrangement 302. In various embodiments, airflow 392 is received by compressor 330 from VSCF converter 320 in response to electric motor 340 driving compressor 330. In this regard, VSCF converter 320 may be in fluid communication with compressor 330. In various embodiments, airflow 392 is received by electric motor 340 from compressor 330 in response to electric motor 340 driving compressor 330. In this regard, electric motor 340 may be in fluid communication with compressor 330.

In various embodiments, airflow 392 may be drawn into the compressor 330 at a compressor inlet 332, compressed by the compressor 330, and then expelled from the compressor 330 at a compressor outlet 334. The compressor 330 in operation compresses airflow 392 that has entered the arrangement 300 through the ALFC duct arrangement 302. An electric motor 340 is operably connected to the compressor 330. The electric motor 340 may be operably connected to the compressor 330 through a drive shaft 335. The electric motor 340 may rotate drive shaft 335 to drive compressor 330. The electric motor 340 in operation drives the compressor 330, thus allowing the compressor 330 to compress airflow 392. The electric motor 340 comprises a motor case 342, a back iron 356, a motor stator 354 radially inward from the back iron 356, and a motor rotor 352 radially inward from the motor stator 354. A gap 353 may exist between the motor stator 354 and the motor rotor 352.

The arrangement 300 in operation directs air through the back iron 356 and in between the motor stator 354 and motor rotor 352 (i.e. through the gap 353). As air flows through the motor case 342, heat is removed from the back iron 356, the motor stator 354, and the motor rotor 352. The back iron 356 may have cooling channels and/or cooling fins to enhance transfer of heat from the back iron 356 to the cooling flow of airflow 392. The airflow 392 can also pass over the end windings 358 of the motor stator 354 to provide additional cooling to the motor stator 354.

The arrangement 300 may include a duct (also referred to herein as a second duct) 344 coupled between the compressor outlet 334 and the motor case 342 and configured to direct the airflow 392 from compressor 330 to motor case 342 as previously described. The arrangement 300 may include a duct (also referred to herein as a third duct) 346 coupled between the motor case 342 and the compressor inlet 332 and configured to direct the airflow 392 from motor case 342 to compressor 330. Thus, the airflow 392 that passes from the compressor 120 to the motor case 342, may also be recirculated to the compressor 120 and through the motor case 342. In this manner, the airflow 392 may not be choked (or "bottleneck") at the relatively small orifices (e.g., see orifices 274 of FIG. 2) of the ALFC duct arrangement 302. It is appreciated that, instead of routing airflow 392 back through compressor the duct 346 may also be configured to route the airflow 392 overboard (i.e., externally to the nacelle). Furthermore, it is appreciated that motor case 342 may comprise various vents through which airflow 392 may exit motor case 342. Thus, airflow 392 may not be circulated between compressor 330 and motor case 342 in perpetuity, rather new air is introduced into the arrangement 300 via ALFC duct arrangement 302 as used air exits the arrangement 300.

Figure 4:
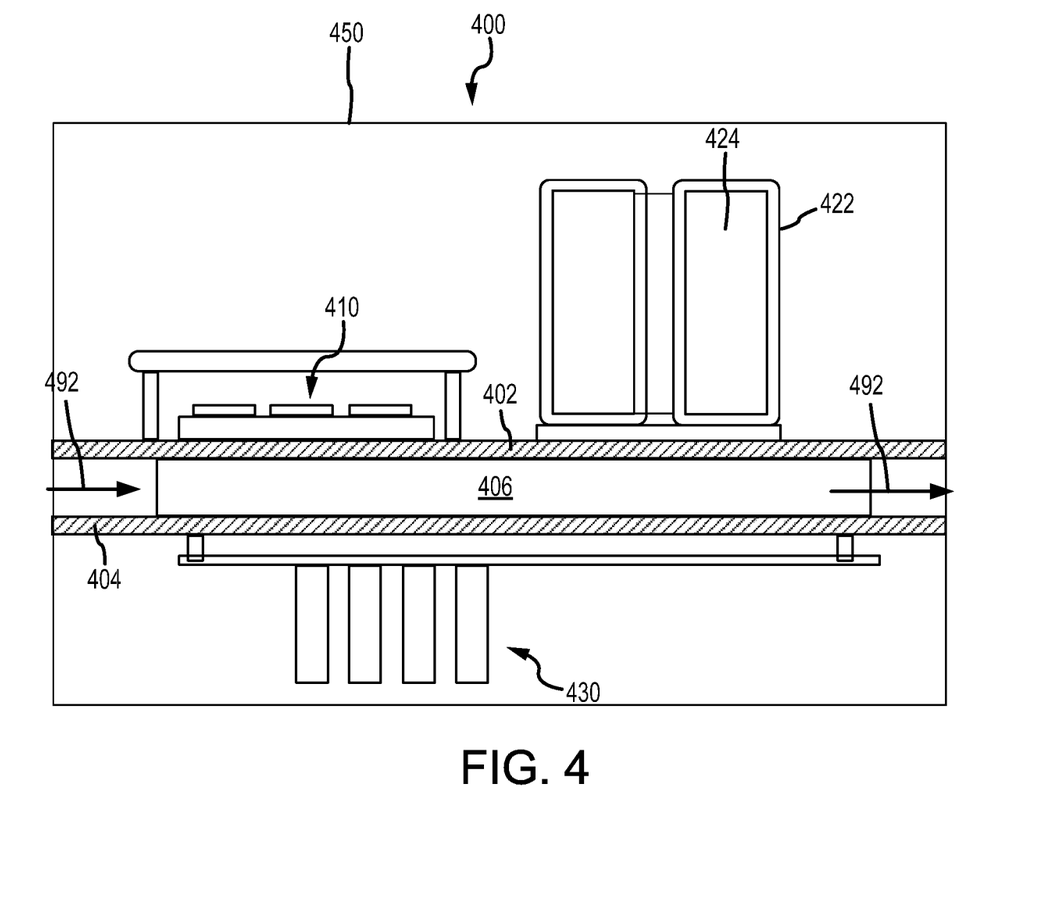
FIG. 4 is a schematic view of an exemplary VSCF converter having an airflow flowing there through for cooling the VSCF converter, in accordance with various embodiments.

With reference to FIG. 4, a VSCF converter 400 is illustrated, in accordance with various embodiments. VSCF converter 400 may be similar to VSCF converter 320 (see FIG. 3). An airflow 492 may be routed through VSCF converter 400. Airflow 492 may be similar to airflow 392 (see FIG. 3). Thus, airflow 492 may be drawn through VSCF converter 400 via a compressor as described herein (see FIG. 3).

VSCF converter 400 may comprise a housing 450 having various electronic components disposed therein. VSCF converter 400 may comprise a first plate 402, a second plate 404, and a fin core 406 extending between first plate 402 and second plate 404. Electronic components may be mounted to first plate 402 and/or second plate 404. In various embodiments, a power module 410 is mounted to first plate 402. In various embodiments, a winding 422 wrapped around a core 424 is mounted to first plate 402. In various embodiments, one or more capacitors 430 are mounted to second plate 404. Power module 410, winding 422, and/or capacitors 430 may generate heat during operation of VSCF converter 400. As airflow 492 flows through fin core 406, heat generated by VSCF converter 400 is transferred to airflow 492 and carried away from VSCF converter 400 via airflow 492. This heat may be conductively transferred from power module 410, winding 422, and/or capacitors 430 to first plate 402, second plate 404, and/or fin core 406, whereby said heat is convectively transferred to airflow 492. Thus, airflow 492 may be received by housing 450 from ALFC duct arrangement 302 (see FIG. 3).

Figure 5:
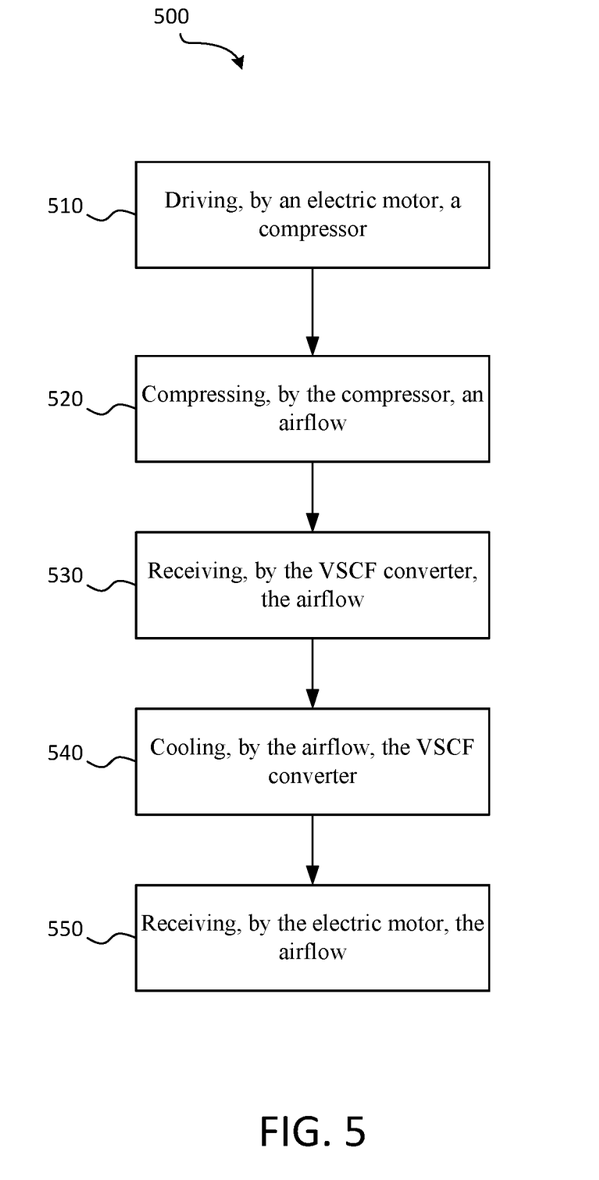
FIG. 5 is a flow chart illustrating a method for cooling a VSCF converter, in accordance with various embodiments.

With reference to FIG. 5, a method 500 for cooling a VSCF converter is provided, in accordance with various embodiments. Method 500 includes driving, by an electric motor, a compressor (step 510). Method 500 includes compressing, by the compressor, an airflow (step 520). Method 500 includes receiving, by the VSCF converter, the airflow (step 530). Method 500 includes cooling, by the airflow, the VSCF converter (step 540). Method 500 includes comprising receiving, by the electric motor, the airflow (step 550).

With combined reference to FIG. 3 and FIG. 5, step 510 may include driving, by electric motor 340, compressor 330 via driveshaft 335. Step 520 may include compressing, by compressor 330, airflow 392 in response to compressor 330 being driven by electric motor 340. Step 530 may include receiving, by VSCF converter 320, airflow 392 in response to compressor 330 being driven by electric motor 340. Step 540 may include cooling, by airflow 392, VSCF converter 320 in response to the airflow 392 being received by VSCF converter 320. Step 550 may include receiving, by electric motor 340, airflow 392 subsequent to airflow 392 being compressed by compressor 330.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

I claim:

1. An active laminar flow control arrangement for an aircraft, comprising:
   an aerodynamic surface of the aircraft;
   a laminar flow control duct, wherein the aerodynamic surface comprises a plurality of orifices whereby the laminar flow control duct is in fluid communication with the aerodynamic surface;
   a variable speed constant frequency (VSCF) converter comprising a housing, wherein the laminar flow control duct is coupled to the housing;
   a compressor coupled to the housing; and
   an electric motor operably coupled to the compressor;
   wherein the laminar flow control duct is configured to receive an airflow from the aerodynamic surface;
   the airflow is received by the housing from the laminar flow control duct in response to the electric motor driving the compressor; and
   the laminar flow control duct is configured to maintain a laminar airflow over the aerodynamic surface in response to receiving the airflow from the aerodynamic surface.

2. The active laminar flow control arrangement of claim 1, wherein the compressor compresses the airflow.

3. The active laminar flow control arrangement of claim 2, wherein the airflow is received by the compressor from the housing in response to the electric motor driving the compressor.

4. The active laminar flow control arrangement of claim 3, wherein the airflow is received by the electric motor from the compressor in response to the electric motor driving the compressor.

5. The active laminar flow control arrangement of claim 1, wherein the VSCF converter comprises a first plate, a second plate, and a fin core extending between the first plate and the second plate.

6. The active laminar flow control arrangement of claim 5, wherein the airflow flows across the fin core and provides cooling to the VSCF converter.

7. The active laminar flow control arrangement of claim 1, wherein the VSCF converter is configured to convert a three-phase variable frequency power to a three-phase constant frequency power.

8. The active laminar flow control arrangement of claim 7, wherein the three-phase variable frequency power is received from a generator that is driven by a gas turbine engine.

9. The active laminar flow control arrangement of claim 3, further comprising a duct coupled between the housing and the compressor whereby the airflow is directed from the VSCF converter and the compressor.

10. A cooling arrangement comprising:
    an aerodynamic surface of an aircraft;

a laminar flow control duct, wherein the aerodynamic surface comprises a plurality of orifices whereby the laminar flow control duct is in fluid communication with the aerodynamic surface;

a variable speed constant frequency (VSCF) converter comprising a plurality of electronic components disposed in a housing, wherein the laminar flow control duct is coupled to the housing;

a compressor coupled to the housing; and an electric motor operably coupled to the compressor;
wherein the cooling arrangement is configured to receive an airflow from the aerodynamic surface, and
the airflow is drawn from the aerodynamic surface into the laminar flow control duct, from the laminar flow control duct into the housing, and from the housing into the compressor in response to the electric motor driving the compressor; and
the laminar flow control duct is configured to maintain a laminar airflow over the aerodynamic surface in response to receiving the airflow from the aerodynamic surface.

11. The cooling arrangement of claim 10, wherein the compressor is in fluid communication with the housing.

12. The cooling arrangement of claim 11, wherein the electric motor is in fluid communication with the housing.

13. The cooling arrangement of claim 12, wherein the airflow is received by the electric motor from the compressor in response to the electric motor driving the compressor.

14. The cooling arrangement of claim 13, wherein the airflow provides cooling to the VSCF converter in response to the airflow flowing through the housing.

15. The cooling arrangement of claim 14, further comprising a first duct coupled between the housing and the compressor.

16. The cooling arrangement of claim 15, further comprising a second duct coupled between the compressor and the electric motor whereby the airflow is received by the electric motor from the compressor.

17. The cooling arrangement of claim 16, further comprising a third duct coupled between the compressor and the electric motor whereby the airflow is recirculated from the electric motor to the compressor.

18. A method for cooling a variable speed constant frequency (VSCF) converter, comprising:

driving, by an electric motor, a compressor;

compressing, by the compressor, an airflow in response to the compressor being driven by the electric motor;

receiving, by a laminar flow control duct, the airflow from an aerodynamic surface of an aircraft in response to the compressor being driven by the electric motor, wherein the aerodynamic surface comprises a plurality of orifices whereby the laminar flow control duct is in fluid communication with the aerodynamic surface, and the laminar flow control duct is configured to maintain a laminar airflow over the aerodynamic surface in response to receiving the airflow from the aerodynamic surface;

receiving, by the VSCF converter, the airflow in response to the compressor being driven by the electric motor, wherein the airflow is received via an aerodynamic surface of an aircraft structure; and cooling, by the airflow, the VSCF converter in response to the airflow being received by the VSCF converter.

19. The method of claim 18, further comprising receiving, by the VSCF converter, the airflow prior to the airflow being compressed by the compressor.

20. The method of claim 19, further comprising receiving, by the electric motor, the airflow subsequent to the airflow being compressed by the compressor.

* * * * *